United States Patent
Song et al.

(10) Patent No.: US 9,098,670 B2
(45) Date of Patent: Aug. 4, 2015

(54) DOUBLE PATTERNING LAYOUT DESIGN METHOD

(71) Applicant: SAMSUNG ELECTRONICS CO., LTD., Suwon-Si, Gyeonggi-Do (KR)

(72) Inventors: Tae-Joong Song, Seongnam-Si (KR); Jae-Ho Park, Suwon-Si (KR); Kwang-Ok Jeong, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/258,065

(22) Filed: Apr. 22, 2014

(65) Prior Publication Data

US 2014/0380256 A1 Dec. 25, 2014

(30) Foreign Application Priority Data

Jun. 24, 2013 (KR) ........................ 10-2013-0072507

(51) Int. Cl.
*G06F 17/50* (2006.01)
*G03F 7/00* (2006.01)
*G03F 1/70* (2012.01)

(52) U.S. Cl.
CPC .............. *G06F 17/5072* (2013.01); *G03F 1/70* (2013.01); *G03F 7/0035* (2013.01); *G06F 17/5068* (2013.01)

(58) Field of Classification Search
CPC ... G06F 17/5072; G06F 17/5068; G03F 1/70; G03F 7/0035

USPC ....................................................... 716/51–55
See application file for complete search history.

(56) References Cited

U.S. PATENT DOCUMENTS

| | | | | |
|---|---|---|---|---|
| 7,675,783 B2 * | 3/2010 | Park et al. | ................ | 365/185.24 |
| 7,842,600 B2 * | 11/2010 | Yun et al. | ...................... | 438/619 |
| 7,873,935 B2 * | 1/2011 | Jung et al. | ....................... | 716/53 |
| 8,078,998 B2 | 12/2011 | Haffner et al. | | |
| 8,247,291 B2 * | 8/2012 | Min et al. | ...................... | 438/257 |
| 8,589,831 B1 * | 11/2013 | Chang et al. | ..................... | 716/55 |
| 8,683,392 B2 * | 3/2014 | Hsieh et al. | ...................... | 716/52 |
| 8,709,684 B2 * | 4/2014 | Chern et al. | ...................... | 430/5 |
| 8,732,628 B1 * | 5/2014 | Wu et al. | ........................ | 716/52 |
| 8,871,104 B2 * | 10/2014 | Park et al. | ....................... | 216/41 |
| 2006/0215467 A1 | 9/2006 | Partsch | | |
| 2013/0024822 A1 * | 1/2013 | Hsieh et al. | ..................... | 716/52 |
| 2013/0086536 A1 * | 4/2013 | Kim et al. | ....................... | 716/55 |
| 2013/0214413 A1 * | 8/2013 | Lee et al. | ....................... | 257/741 |
| 2013/0266292 A1 * | 10/2013 | Sandrew et al. | ............... | 386/282 |
| 2014/0162460 A1 * | 6/2014 | Lee et al. | ....................... | 438/703 |

* cited by examiner

*Primary Examiner* — Helen Rossoshek
(74) *Attorney, Agent, or Firm* — Volentine & Whitt, PLLC

(57) ABSTRACT

A double patterning layout design method includes defining critical paths including a first path and a second path on a schematic circuit, and defining a double patterning layout divided into a first mask layout having a first color and a second mask layout having a second color, the double patterning layout corresponding to the schematic circuit. The defining of the double patterning layout includes anchoring the critical paths on the schematic circuit.

7 Claims, 9 Drawing Sheets

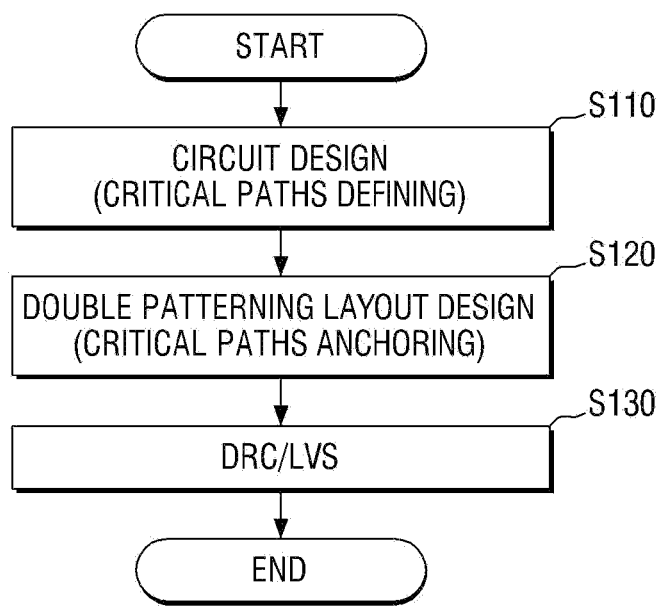
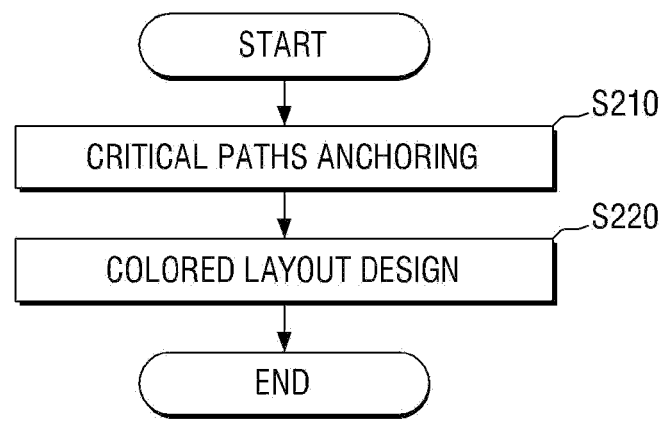

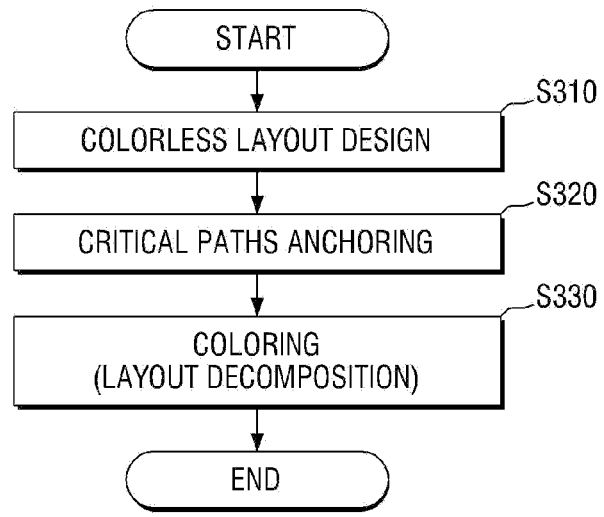
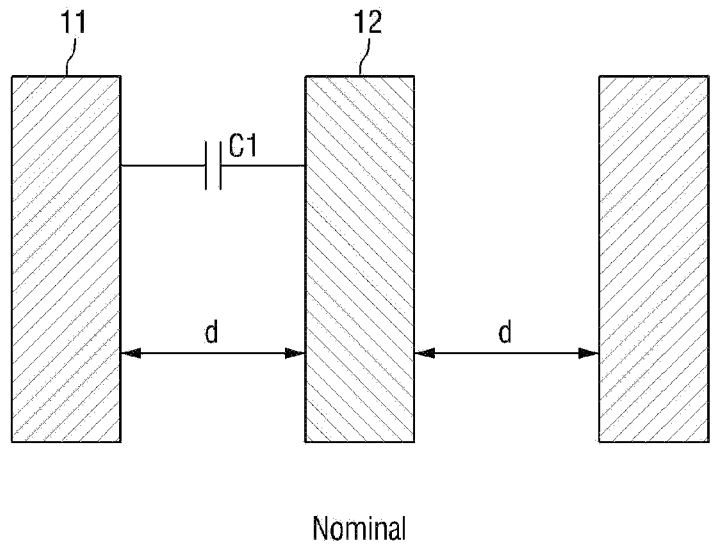

Worst

Best

Skew Modeling

| PATTERN<br>CASE | A | B |
|---|---|---|
| 1 | RC Best | RC Best |
| 2 | Nominal | Nominal |
| 3 | RC Worst | RC Worst |

Skew Modeling

| CASE \ PATTERN | A | B |
|---|---|---|
| 1 | RC Best | RC Worst |
| 2 | Nominal | Nominal |
| 3 | Nominal | RC Worst |
| 4 | Nominal | RC Best |

DOUBLE PATTERNING LAYOUT DESIGN METHOD

CROSS-REFERENCE TO RELATED APPLICATION

This application claims priority under 35 U.S.C. §119 to Korean Patent Application No. 10-2013-0072507 filed on Jun. 24, 2013, the subject matter of which is hereby incorporated by reference.

BACKGROUND OF THE INVENTION

The inventive concept relates generally to semiconductor manufacturing processes, and more particularly to a double patterning layout design method that can be used in semiconductor manufacturing.

A double patterning method can be used in semiconductor manufacturing to perform high resolution etching. In the double patterning method, a layer of material is patterned using two or more masks. Because two or more masks are used, the double patterning method may provide a desired level of resolution that cannot be achieved by using a single mask.

SUMMARY OF THE INVENTION

In one embodiment of the inventive concept, a double patterning layout design method comprises defining critical paths comprising a first path and a second path on a schematic circuit, and defining a double patterning layout divided into a first mask layout having a first color and a second mask layout having a second color, the double patterning layout corresponding to the schematic circuit. The defining of the double patterning layout comprises anchoring the critical paths on the schematic circuit.

In another embodiment of the inventive concept, a double patterning layout design method comprises receiving information on a defined schematic circuit and critical paths defined on the schematic circuit, defining a double patterning layout divided into a first mask layout having a first color and a second mask layout having a second color, the double patterning layout corresponding to the schematic circuit, and outputting the defined double patterning layout. The defining of the double patterning layout comprises anchoring the critical paths on the schematic circuit.

In another embodiment of the inventive concept, a system configured to design a double patterning layout comprises a processor configured to define critical paths comprising a first path and a second path on a schematic circuit and define a double patterning layout divided into a first mask layout having a first color and a second mask layout having a second color, the double patterning layout corresponding to the schematic circuit. The defining of the double patterning layout comprises anchoring the critical paths on the schematic circuit.

In general, where different colors are applied to adjacent patterns on the double patterning layout, a change in the capacitance may be independently demonstrated globally/locally. If different colors are applied to critical paths on the double patterning layout, a considerably large AC mismatch may be generated. Accordingly in certain embodiments, the same color is applied to polygons corresponding to critical paths thereby reducing a mismatch due to double patterning.

BRIEF DESCRIPTION OF THE DRAWINGS

The drawings illustrate selected embodiments of the inventive concept. In the drawings, like reference numbers indicate like features.

FIG. 1 is a flowchart illustrating a double patterning layout design method according to an embodiment of the inventive concept.

FIG. 2 is a flowchart illustrating a step of the layout design method of FIG. 1, according to an embodiment of the inventive concept.

FIG. 5 is a flowchart illustrating a double patterning layout design method according to another embodiment of the inventive concept.

FIG. 6A illustrates an alignment of adjacent patterns during double patterning, according to an embodiment of the inventive concept.

DETAILED DESCRIPTION

Figure 3:
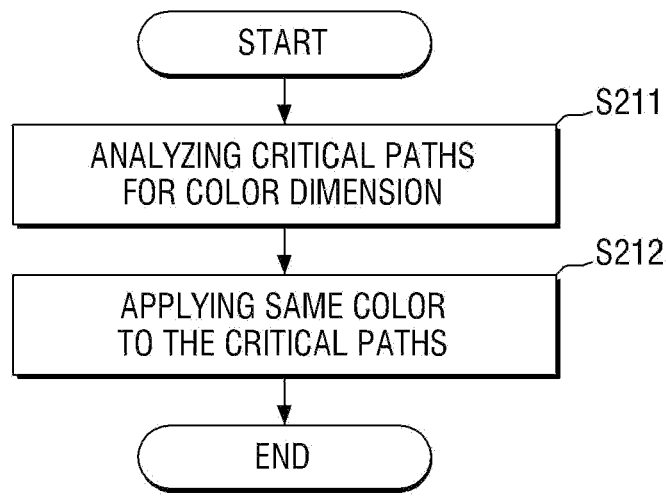
FIG. 3 is a flowchart illustrating a step of critical paths anchoring shown in FIG. 2, according to an embodiment of the inventive concept.

Embodiments of the inventive concept are described below with reference to the accompanying drawings. These embodiments are presented as teaching examples and should not be construed to limit the scope of the inventive concept.

In the description that follows, where a layer is referred to as being "on" another layer or substrate, it can be directly on the other layer or substrate, or intervening layers may also be present. In contrast, where an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents are to be construed to cover both the singular and the plural, unless otherwise indicated herein or clearly contradicted by context. Terms such as "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. The use of any and all examples, or terms provided herein is intended merely to better illuminate the invention and is not a limitation on the scope of the invention unless otherwise specified. Further, terms such as those defined in generally used dictionaries should be interpreted in the relevant context and not in an overly formal sense.

The inventive concept will be described with reference to perspective views, cross-sectional views, and/or plan views, in which preferred embodiments of the invention are shown. The profile of an example view may be modified according to manufacturing techniques and/or allowances. Thus, regions shown in the drawings are illustrated in schematic form and the shapes of the regions are presented simply by way of illustration and not as a limitation.

FIG. 1 is a flowchart illustrating a double patterning layout design method according to an embodiment of the inventive concept.

Referring to FIG. 1, the double patterning layout design method comprises steps of circuit design (S110), double patterning layout design (S120), and design rule check (DRC)/layout versus schematic (LVS) verification (S130).

In the circuit design (S110), a schematic circuit is designed. In the circuit design (S110), a computer aided design (CAD) tool which can represent connected states of circuit devices may be used. A circuit designer may design a schematic circuit using the CAD tool in units of blocks comprising standard cells performing particular functions or non-standard cells. Although not clearly shown in FIG. 1, the circuit design (S110) may further comprise simulation of operations of the designed schematic circuit.

The circuit design (S110) may further comprise defining critical paths on the designed schematic circuit. The critical paths typically comprise a plurality of paths comprising a first path and a second path. Signal lines or other components that are critical to the timing of the schematic circuit may be defined as critical paths. Typically, a critical path comprises a path that requires a relatively long time to complete operations, among a set of interrelated paths. A first signal line and a second signal line, which are critical to timing, may be defined as the first path and the second path.

Next, in the double patterning layout design (S120), a double patterning layout corresponding to the designed schematic circuit is designed. The double patterning layout is divided into a first mask layout and a second mask layout, where the first mask layout has a first color and the second mask layout has a second color. Different colors are applied to the first mask layout and the second mask layout to define polygons separated into a plurality of masks in the course of forming masks. The double patterning layout is separated into three or more mask layouts having different colors. For this reason, the double patterning layout may also be referred to as a multi patterning layout. In this description, the double patterning layout may be defined to include the multi patterning layout. In the double patterning layout design (S120), the layout may be designed in units of blocks comprising standard cells, and an electronic design automation (EDA) tool that can perform coloring on a designed layout may be used.

In addition, the double patterning layout design (S120) may include anchoring critical paths. The term "anchoring" used in the double patterning method indicates that a color of a particular polygon is pre-applied. Thereafter, colors of remaining polygons may be applied based on the anchoring result. Therefore, in this description, the expression "anchoring critical paths" indicates that colors of polygons corresponding to the critical paths are pre-applied while designing a double patterning layout.

Next, in the, design rule check (DRC)/layout versus schematic (LVS) verification (S130) is performed on the designed double patterning layout. That is to say, in the DRC/LVS (S130), it is verified whether the designed double patterning layout satisfies the process design rule or the designed double patterning layout corresponds to the schematic circuit. Although not clearly shown in FIG. 1, in the DRC/LVS (S130), post-simulation may be performed.

FIG. 2 is a flowchart illustrating a step of layout design shown in FIG. 1, according to an embodiment of the inventive concept.

Referring to FIG. 2, the layout design (S120) of FIG. 1 may be performed using a colored drawing method. In the colored drawing method, a plurality of mask layouts are designed while placement & routing and coloring are simultaneously performed. In this case, because the design rule is relatively small, a layout designer may design an optimized layout. However, a design turn-around time (TAT) may increase to take colors into consideration. The aforementioned colored drawing method may also be referred to as a manual decomposition method.

First, the critical paths on the designed schematic circuit may be anchored (S210). To anchor the critical paths using the colored drawing method, colored layouts of polygons corresponding to the critical paths may be pre-designed. When using the colored drawing method, placement & routing and coloring are simultaneously performed, so colors of the polygons corresponding to the critical paths may be applied prior to the remaining polygons by pre-designing colored layouts of the polygons corresponding to the critical paths.

Next, colored layouts of polygons corresponding to the remaining components on the designed schematic circuit may be designed (S220). For example, the layout designer may allocate colors of polygons corresponding to the remaining components on the designed schematic circuit randomly or a predetermined rule.

FIG. 3 is a flowchart illustrating a step of critical paths anchoring shown in FIG. 2, according to an embodiment of the inventive concept.

Referring to FIG. 3, first, critical paths for color dimension are analyzed (S211). Here, the critical paths may be detected (or searched) from the designed schematic circuit using information on the critical paths. Next, the same color may be applied to the critical paths (S212). In detail, a single color may be applied to a first polygon corresponding to a first path and a second polygon corresponding to a second path. At the same time, placement & routing of the first polygon and the second polygon may be performed.

Figure 4:
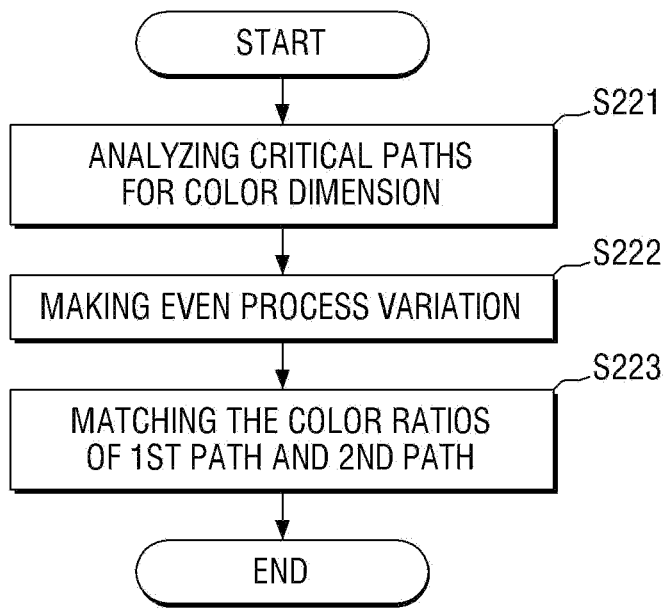
FIG. 4 is a flowchart illustrating an application example of the step of critical paths anchoring shown in FIG. 2, according to an embodiment of the inventive concept.

FIG. 4 is a flowchart illustrating an application example of the step of critical paths anchoring shown in FIG. 2, according to an embodiment of the inventive concept. To avoid redundancy, the following description will focus on differences between the steps shown in FIGS. 3 and 4.

Referring to FIG. 4, the critical paths for color dimension are analyzed (S221). Next, an even process variation is made (S222). The making of the even process variation comprises patterning the first path and the second path of the critical paths by even-numbered mask layouts by splitting or dicing the first path and the second path into even-numbered parts. Next, color ratios of the first polygon corresponding to the first path and the second polygon corresponding to the second path may be matched (S223). For example, the color ratios of the first polygon and the second polygon may be averaged. At the same time, placement and routing of the first polygon and the second polygon are also performed.

FIG. 5 is a flowchart illustrating a double patterning layout design method according to another embodiment of the inventive concept. To avoid redundancy, the following description will focus on differences between the steps of layout design according to the present and previous embodiments.

Referring to FIG. 5, a step of layout design in the double patterning layout design method may be performed using a colorless drawing method. In the colorless drawing method, placement and routing are performed to design a single mask layout, followed by performing coloring on the single mask layout, thereby separating the single mask layout into a plurality of mask layouts. In this case, the design rule is typically relatively large, so there may be an overhead in the layout result. However, design TAT may be reduced in view of convenience in design. The aforementioned colorless drawing method may also be referred to as an automated decomposition method.

First, a colorless layout corresponding to the designed schematic circuit is designed (S310). For example, the layout designer may design polygons corresponding to various components on the designed schematic circuit randomly or in a predetermined rule. Here, no color is applied to the designed colorless layout. That is to say, the colorless layout is designed using a single mask layout that is not separated.

Next, the critical paths on the designed schematic circuit are anchored (S320). To anchor the critical paths using the colorless drawing method, the polygons corresponding to the critical paths on the designed schematic circuit may be pre-colored. In a case of using the colorless drawing method, because the placement and routing are sequentially performed, the polygons corresponding to the critical paths are pre-colored, thereby pre-applying colors of the polygons corresponding to the critical paths to the remaining polygons.

Next, the remaining polygons on the designed colorless layout may be colored (S330). The coloring of the remaining polygons may be performed automatically (or in a software manner) using the aforementioned EDA tool. The coloring of the remaining polygons may be performed randomly or in a predetermined algorithm. In the step of layout design in the double patterning layout design method according to another embodiment of the inventive concept, anchoring of the critical paths may be performed in substantially the same manner as in the anchoring of the critical paths shown in FIGS. 3 and 4.

Figure 6B:
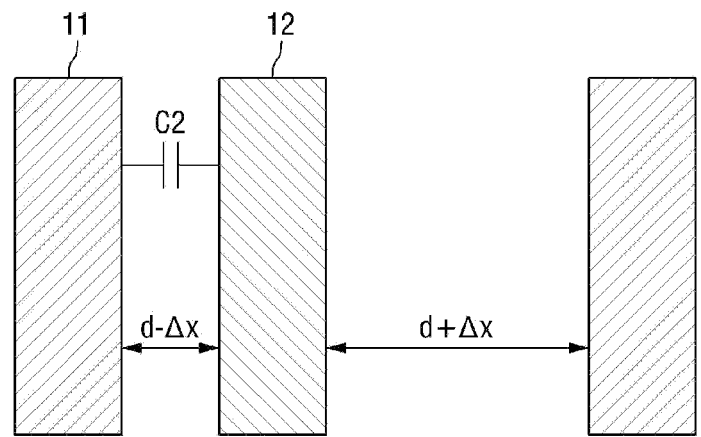
FIG. 6B illustrates a change in capacitance due to a shift (or misalignment) of adjacent patterns during the double patterning, according to an embodiment of the inventive concept.
Figure 6C:
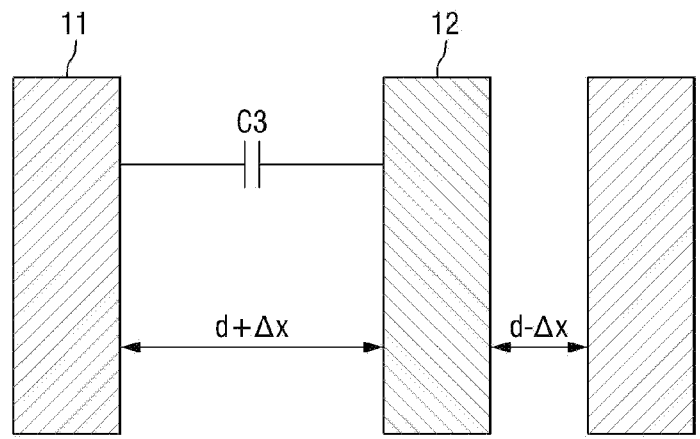
FIG. 6C illustrates another change in the capacitance due to a shift (or misalignment) of adjacent patterns during double patterning, according to an embodiment of the inventive concept.

FIGS. 6A to 6C illustrate a change in the capacitance due to a shift (or misalignment) of adjacent patterns during double patterning, according to an embodiment of the inventive concept.

Referring to FIGS. 6A to 6C, a first pattern 11 and a second pattern 12 may be adjacent patterns formed using different mask layouts. For example, first pattern 11 may be formed by a first mask layout and second pattern 12 may be formed by a second mask layout. On the double patterning layout, different colors may be applied to a polygon corresponding to first pattern 11 and a polygon corresponding to second pattern 12. According to the doubling patterning method, first pattern 11 and second pattern 12 may be formed by lithography processes sequentially performed on a single layer. First pattern 11 and second pattern 12 may be formed by patterning a metal layer or a silicon layer, but aspects of the inventive concept are not limited thereto.

Ideally, second pattern 12 should be formed at a position designed by the second mask layout. However, due to a process variation, second pattern 12 may be shifted from the position designed by the second mask layout. second pattern 12 may be shifted in a first direction (e.g., in the left-and-right direction of FIGS. 6A to 6C) and/or in a second direction (e.g., in the up-and-down direction of FIGS. 6A to 6C). The shifting of second pattern 12 may change parasitic capacitance between first pattern 11 and second pattern 12.

As illustrated in FIG. 6A, where a distance between first pattern 11 and second pattern 12 is maintained at a distance d as designed, the parasitic capacitance affecting first pattern 11 may be C1. In addition, as illustrated in FIG. 6B, if second pattern 12 is shifted to the left so that a distance between first pattern 11 and second pattern 12 is reduced to d-$\Delta$x, the parasitic capacitance affecting first pattern 11 may be C2. However, as illustrated in FIG. 6C, where second pattern 12 is shifted to the right so that a distance between first pattern 11 and second pattern 12 is increased to d+$\Delta$x, the parasitic capacitance affecting first pattern 11 may be C3. As described above, in the case of parasitic capacitance C2 of FIG. 6B, the parasitic capacitance affecting first pattern 11 may be changed in the worst condition, and in the case of parasitic capacitance C3 of FIG. 6C, the parasitic capacitance affecting first pattern 11 may be changed in the best condition.

Meanwhile, a change in the capacitance may vary performance of a corresponding circuit (for example, AC mismatch). As described above, where different colors are applied to adjacent patterns on the double patterning layout, the change in the capacitance may be independently demonstrated globally/locally. In particular, if different colors are applied to critical paths on the double patterning layout, a considerably large AC mismatch may be generated.

Figures 7A, 7B:
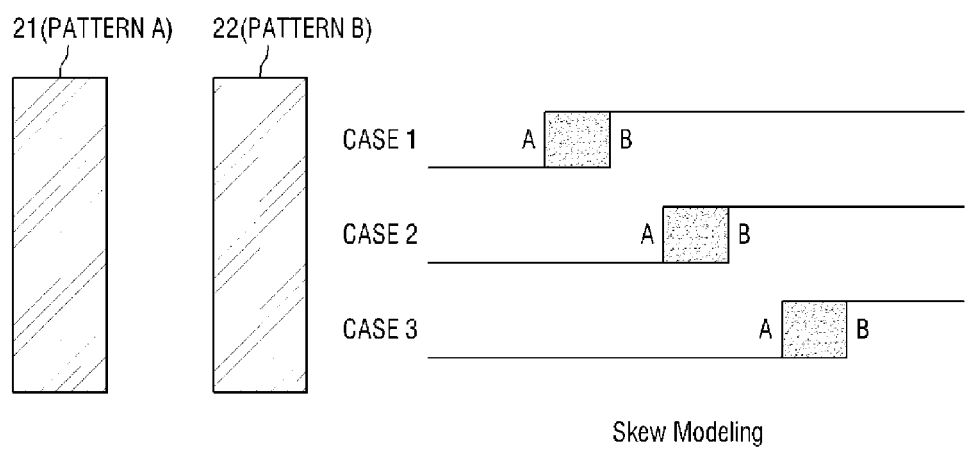
FIG. 7A illustrates skew modeling in a case where a process variation occurs to adjacent patterns having the same color, according to an embodiment of the inventive concept.
FIG. 7B is a table illustrating resistance-capacitance (RC) variations of adjacent patterns, according to an embodiment of the inventive concept.

FIG. 7A illustrates skew modeling in a case where process variation occurs to adjacent patterns having the same color, and FIG. 7B is a table illustrating RC variations of adjacent patterns. In the description of FIGS. 7A and 7B, adjacent patterns 21 and 22 having the same color mean adjacent patterns 21 and 22 being patterned by the same mask layout.

Referring to FIG. 7A, adjacent patterns 21 and 22 having the same color are shifted by a process variation in the same direction. For example, if resistance of pattern A 21 is reduced and capacitance of pattern A 21 is increased, resistance of pattern B 22 is also reduced and capacitance of pattern B 22 is also increased. In addition, if the resistance of pattern A 21 is increased and the capacitance of pattern A 21 is reduced, the resistance of pattern B 22 is also increased and the capacitance of pattern B 22 is also reduced.

As in first to third cases (CASES 1 to 3) shown in FIG. 7A, both pattern A 21 and pattern B 22 may be shifted to the left, may be positioned as designed, or may be shifted to the right. However, as listed in the table shown in FIG. 7B, where the RC variation of pattern A 21 is in the best condition, the RC variation of pattern B 22 is also in the best condition, when the RC variation of pattern A 21 is in the nominal condition, the RC variation of pattern B 22 is also in the nominal condition, and when the RC variation of pattern A 21 is in the worst condition, the RC variation of pattern B 22 is also in the worst condition. That is to say, because the RC variations of pattern A 21 and pattern B 22 vary with the same directionality, a timing skew of adjacent patterns 21 and 22 may not be changed even if there is a process variation occurred.

Figures 8A, 8B:
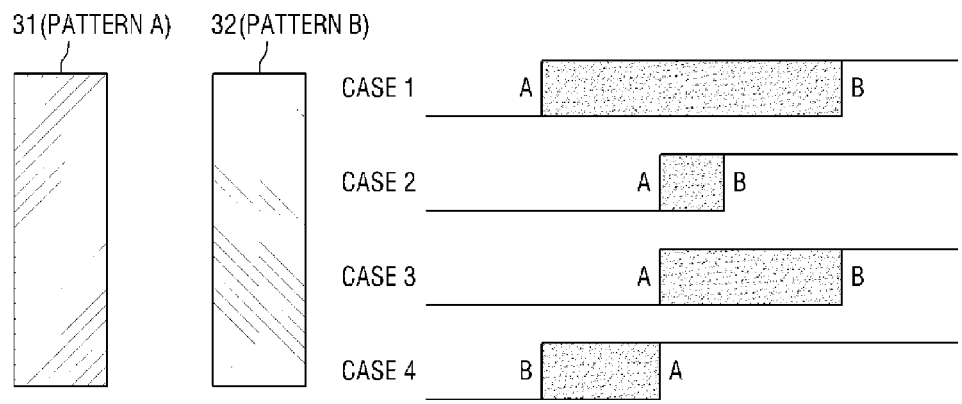
FIG. 8A illustrates skew modeling in a case where a process variation occurs to adjacent patterns having different colors, according to an embodiment of the inventive concept.
FIG. 8B is a table illustrating RC variations of adjacent patterns of FIG. 8A, according to an embodiment of the inventive concept.

FIG. 8A illustrates skew modeling in a case where a process variation occurs to adjacent patterns having different colors, and FIG. 8B is a table illustrating RC variations of adjacent patterns of FIG. 8A. In the description of FIGS. 8A and 8B, adjacent patterns 31 and 32 having different colors mean adjacent patterns 31 and 32 being patterned by different mask layouts.

Referring to FIG. 8A, adjacent patterns 31 and 32 having different colors are shifted by process variation in independent directions. For example, pattern A 31 and pattern B 32 may be shifted in the same direction or in different directions. Alternatively, only one of pattern A 31 and pattern B 32 may be shifted. In a first case (CASE 1) shown in FIG. 8A, pattern A 31 is shifted to the left and pattern B 32 is shifted to the right. In a second case (CASE 2), pattern A 31 and pattern B 32 are positioned as designed. Alternatively, in a third case (CASE 3), only pattern B 32 is shifted to the right, or in a fourth case (CASE 4), only pattern B 32 is shifted to the left. In addition, as listed in the table shown in FIG. 8B, because RC variations of pattern A 31 and pattern B 32 vary independently, when the RC variation of pattern A 31 is in the best condition and the RC variation of pattern B 32 is in the worst condition, a timing skew of adjacent patterns 31 and 32 may be considerably increased.

In the step of layout design in the double patterning layout design method according to some embodiments of the inventive concept, the same color is applied to polygons corresponding to critical paths, so that RC variations of the critical paths vary with the same directionality, thereby reducing a mismatch due to double patterning. In addition, in the step of layout design, color ratios of the polygons corresponding to critical paths are matched, thereby matching directionality of RC variations of the critical paths, thereby reducing a mismatch due to double patterning.

Figure 9:
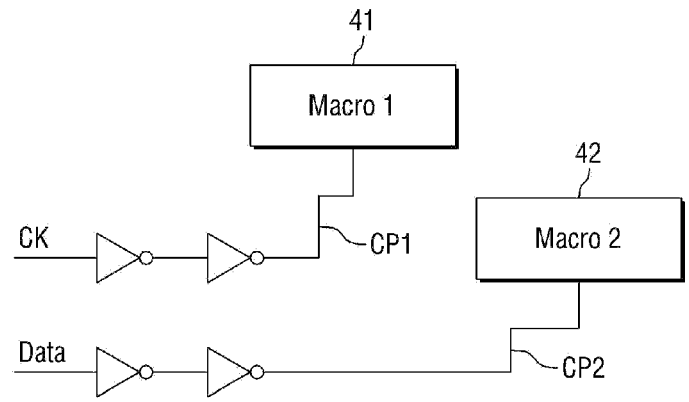
FIG. 9 illustrates critical paths on a schematic circuit, according to an embodiment of the inventive concept.
Figure 10A:
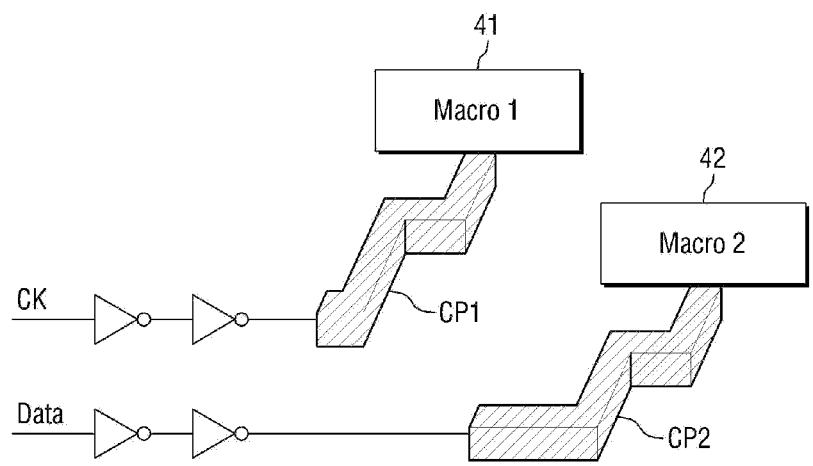
FIG. 10A illustrates a layout adopting a double patterning layout design method according to an embodiment of the inventive concept.
Figure 10B:
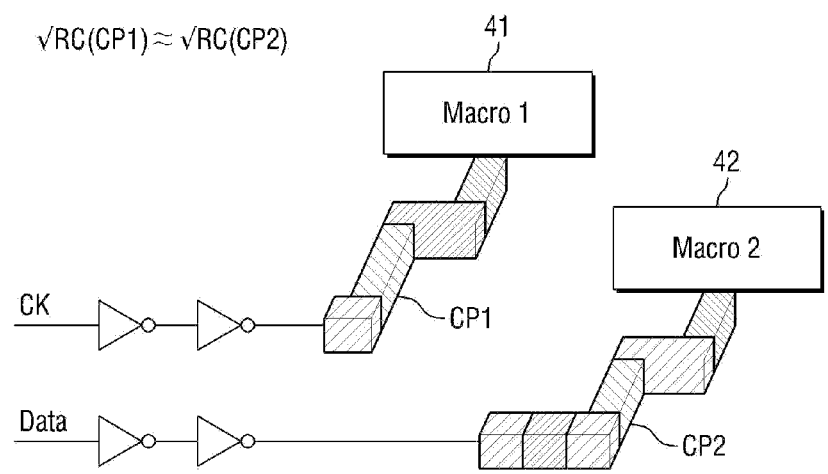
FIG. 10B illustrates a layout adopting a double patterning layout design method according to another embodiment of the inventive concept.

FIG. 9 illustrates critical paths on a schematic circuit, FIG. 10A illustrates a layout adopting a double patterning layout design method according to an embodiment of the inventive concept, and FIG. 10B illustrates a layout adopting a double patterning layout design method according to another embodiment of the inventive concept.

Referring to FIG. 9, a schematic circuit 40 may include a plurality of macro (or core) blocks 41 and 42. A first path may be connected to first macro block 41 (Macro 1) and a second path may be connected to second macro block 42 (Macro 2). For example, a clock signal CK may be input to first macro block 41 through a first path, and a data signal Data may be input to second macro block 42 through a second path. In the following description, it is assumed that signal lines of clock signal CK and data signal Data are critical paths CP1 and CP2, which are critical to timing.

Referring to FIG. 10A, where the double patterning layout design method according to an embodiment of the inventive concept is adopted, the same color may be pre-applied to the polygon of first path CP1 and the polygon of second path CP2.

Referring to FIG. 10B, where the double patterning layout design method according to another embodiment of the inventive concept is adopted, four different colors may be pre-applied to the polygon of first path CP1 and the polygon of second path CP2. To make first path CP1 and second path CP2 have RC variations similar to each other, color ratios of the polygon of first path CP1 and the polygon of second path CP2 are matched.

The above-described double patterning layout design method may be applied in various manners in designing a memory cell region (for example, a memory cell region of a memory device, such as SRAM, DRAM, or flash memory), an IC device comprising a logic block coupled to the memory cell region or a transistor (for example, fin-FET).

Figure 11:
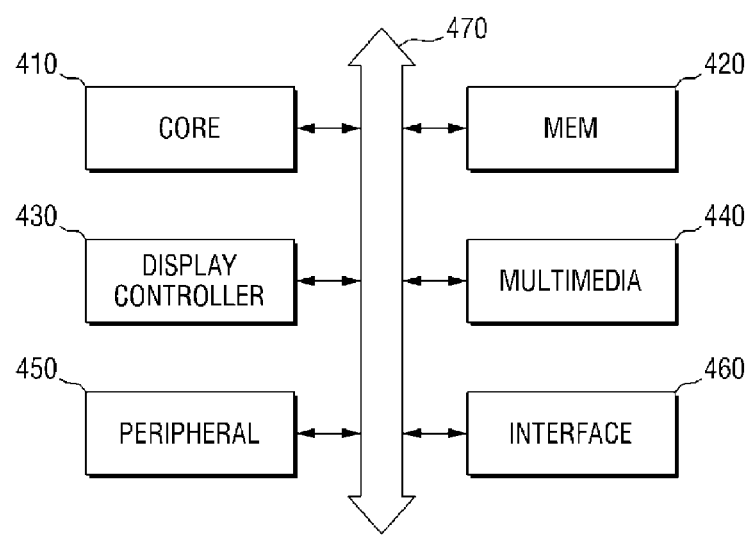
FIG. 11 is a block diagram of a system on chip that can be designed using a double patterning layout design method according to an embodiment of the inventive concept.

FIG. 11 is a block diagram of a system on chip that can be designed using a double patterning layout design method according to an embodiment of the inventive concept.

Referring to FIG. 11, system on chip 400 comprises a core device (CORE) 410, a memory device 420 (MEM), a display controller 430, a multimedia device 440 (MULTIMEDIA), a peripheral device 450 (PERIPHERAL), an interface device 460 (INTERFACE), and a data bus 470.

Core device (CORE) 410, memory device 420 (MEM), display controller 430, multimedia device 440 (MULTIMEDIA), peripheral device 450 (PERIPHERAL), and interface device 460 (INTERFACE) are connected to each other through data bus 470. Data bus 470 corresponds to a path through which data is transmitted.

Core device 410 comprises a single core processor or a plurality of cores (multi core) processors. For example, core device 410 may include a multi core processor, such as a dual core processor, a quad core processor, or a hexa core processor.

Memory device 420 is configured to store data. Memory device 420 typically comprises one or more volatile memories, such as a double data rate static DRAM (DDR SDRAM) or a single data rate static DRAM (SDR SDRAM), and/or one or more nonvolatile memories, such as an electrical erasable programmable ROM (EEPROM), or a flash memory.

Display controller 430 controls a display device to display a picture or an image. Multimedia device 440, comprising a 2D/3D graphic engine, an image signal processor (ISP), a codec engine, etc., may process multimedia operations. Peripheral device 450 may include a serial communication device, a memory management device, an audio processing device, and so on. Interface device 460 transmits data to a communication network or may receive data from the communication network.

The double patterning layout design method according to some embodiments of the inventive concept may be applied in various manners in designing core device 410, memory device 420, display controller 430, multimedia device 440, and so on. Alternatively, the double patterning layout design method according to some embodiments of the inventive concept may also be applied in designing the overall system on chip 400.

Figure 12:
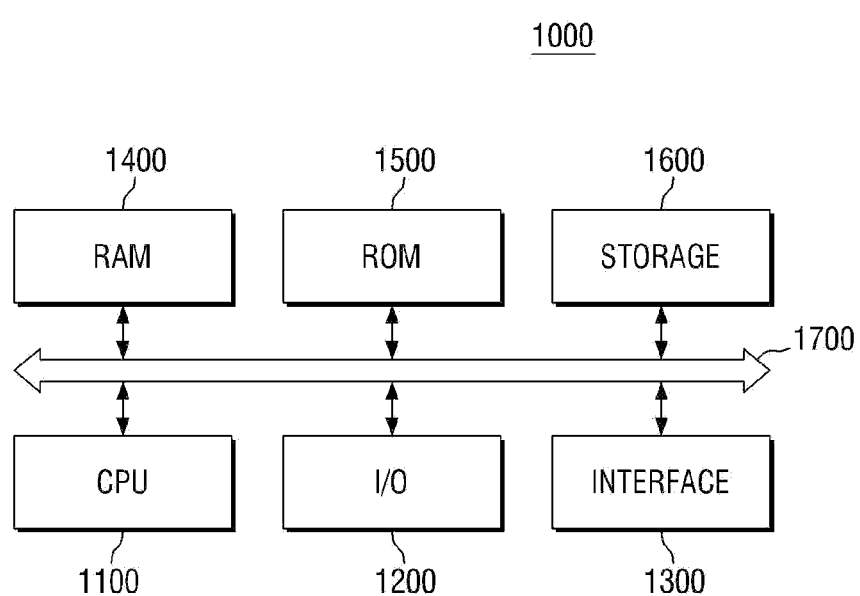
FIG. 12 is a block diagram of a computer system configured to implement a double patterning layout design method according to an embodiment of the inventive concept.

FIG. 12 is a block diagram of a computer system configured to implement a double patterning layout design method according to some embodiments of the inventive concept.

Referring to FIG. 12, computer system 1000 comprises a central processing unit (CPU) 1100, an input/output device (I/O) 1200, an interface 1300, a random access memory (RAM) 1400, a read only memory (ROM) 1500, a storage 1600, and a data bus 1700.

CPU 1100, the I/O 1200, interface 1300, RAM 1400, ROM 1500 and storage 1600 are connected to each other through data bus 1700. Data bus 1700 corresponds to a path through which data is transmitted.

CPU 1100, comprising a controller, an operation device, etc., may execute programs and process data. CPU 1100 typically comprises a cache memory positioned inside or outside CPU 1100. CPU 1100 may execute a program performing at least some steps of the double patterning layout design method according to some embodiments of the inventive concept.

I/O 1200 may comprise one or more input devices, such as a mouse, a keyboard, etc., to input data, and one or more output devices, such as a monitor, a speaker, a printer, etc., to output data. Interface 1300 may transmit data to a communication network or may receive data from the communication network. Interface 1300 may be configured in a wired/wireless manner. For example, interface 1300 may be an antenna or a wired/wireless transceiver. RAM 1400 and ROM 1500 may transceive data to/from CPU 1100 and may store data and/or commands required to execute the program.

Storage device 1600, comprising a nonvolatile memory, such as a floppy disk, a hard disk, a CD-ROM, or a DVD, may store the data and/or commands. The program executing at least some steps of the double patterning layout design method according to some embodiments of the inventive concept may be stored in storage device 1600.

The steps of the double patterning layout design method described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer readable storage medium well known in the related art.

In the double patterning layout design method according to some embodiments of the inventive concept, the steps of circuit design and layout design may be implemented by an integral software module or may be implemented by different software modules. A circuit design module may receive information on critical paths by a circuit designer or may define critical paths on a schematic circuit in a predetermined algorithm. A layout design module may receive information on the designed schematic circuit and the critical paths in the form of data and may output the designed double patterning layout in the form of data. The layout design module may anchor the critical paths or may perform coloring for the colorless layout. In addition, in the step of layout design, the anchoring of the critical paths may be implemented using separate software modules, thereby outputting partially completed data of colored layouts or partially colored data of colorless layouts.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A double patterning layout design method, comprising:
    defining critical paths comprising a first path and a second path on a schematic circuit; and
    defining a double patterning layout divided into a first mask layout having a first color and a second mask layout having a second color, the double patterning layout corresponding to the schematic circuit,
    wherein the defining the critical paths and the defining of the double patterning layout are performed using a processor,
    wherein the defining of the double patterning layout comprises anchoring the critical paths on the schematic circuit by pre-defining colored layouts of polygons corresponding to the critical paths, and
    wherein the pre-defining of the colored layouts of the polygons corresponding to the critical paths comprises applying a plurality of colors to a first polygon corresponding to the first path, applying the plurality of colors to a second polygon corresponding to the second path, and matching color ratios of the first polygon and the second polygon.

2. The double patterning layout design method of claim 1, wherein the defining of the critical paths comprises defining a first signal line and a second signal line which are critical to timing on the schematic circuit as the first path and the second path, respectively.

3. A double patterning layout design method comprising:
    defining critical paths comprising a first path and a second path on a schematic circuit; and
    defining a double patterning layout divided into a first mask layout having a first color and a second mask layout having a second color, the double patterning layout corresponding to the schematic circuit,
    wherein the defining the critical paths and the defining of the double patterning layout are performed using a processor,
    wherein the defining of the double patterning layout further comprises defining a colorless layout corresponding to the schematic circuit, wherein the anchoring of the critical paths on the schematic circuit comprises anchoring the critical paths by pre-coloring polygons corresponding to the critical paths on the colorless layout, and
    wherein the pre-coloring of the polygons corresponding to the critical paths comprises applying a plurality of colors to a first polygon corresponding to the first path, applying the plurality of colors to a second polygon corresponding to the second path, and matching color ratios of the first polygon and the second polygon.

4. A double patterning layout design method comprising:
    receiving information on a defined schematic circuit and critical paths defined on the schematic circuit;
    defining a double patterning layout divided into a first mask layout having a first color and a second mask layout having a second color, the double patterning layout corresponding to the schematic circuit; and
    outputting the defined double patterning layout,
    wherein the defining of the double patterning layout is performed using a processor,
    wherein the defining of the double patterning layout comprises anchoring the critical paths on the schematic circuit by pre-defining colored layouts of polygons corresponding to the critical paths, and
    wherein the pre-defining of the colored layouts of the polygons corresponding to the critical paths comprises applying a plurality of colors to a first polygon corresponding to the first path, applying the plurality of colors to a second polygon corresponding to the second path, and matching color ratios of the first polygon and the second polygon.

5. A double patterning layout design method comprising:
    receiving information on a defined schematic circuit and critical paths defined on the schematic circuit;
    defining a double patterning layout divided into a first mask layout having a first color and a second mask layout having a second color, the double patterning layout corresponding to the schematic circuit; and outputting the defined double patterning layout, wherein the defining of the double patterning layout is performed using a processor, wherein the defining of the double patterning layout further comprises defining a colorless layout corresponding to the schematic circuit, wherein the anchoring of the critical paths on the schematic circuit comprises anchoring the critical paths by pre-coloring polygons corresponding to the critical paths on the colorless layout, and wherein the pre-coloring of the polygons corresponding to the critical paths comprises applying a plurality of colors to a first polygon corresponding to the first path, applying the plurality of colors to a second polygon corresponding to the second path, and matching color ratios of the first polygon and the second polygon.

6. A system configured to design a double patterning layout, comprising:

a processor configured to define critical paths comprising a first path and a second path on a schematic circuit and define a double patterning layout divided into a first mask layout having a first color and a second mask layout having a second color, the double patterning layout corresponding to the schematic circuit, wherein the defining of the double patterning layout comprises anchoring the critical paths on the schematic circuit by pre-defining colored layouts of polygons corresponding to the critical paths, and wherein the pre-defining of the colored layouts of the polygons corresponding to the critical paths comprises applying a plurality of colors to a first polygon corresponding to the first path, applying the plurality of colors to a second polygon corresponding to the second path, and matching color ratios of the first polygon and the second polygon.

7. The system of claim 6, wherein the defining of the critical paths comprises defining a first signal line and a second signal line which are critical to timing on the schematic circuit as the first path and the second path, respectively.

* * * * *